US007754394B2

(12) United States Patent
Crawford et al.

(10) Patent No.: US 7,754,394 B2
(45) Date of Patent: Jul. 13, 2010

(54) METHOD TO ETCH CHROME FOR PHOTOMASK FABRICATION

(75) Inventors: Shaun B Crawford, Jericho, VT (US); Thomas B Faure, Milton, VT (US); Cuc K Huynh, Jericho, VT (US); James P Levin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 500 days.

(21) Appl. No.: 11/559,417

(22) Filed: Nov. 14, 2006

(65) Prior Publication Data

US 2008/0113275 A1    May 15, 2008

(51) Int. Cl.
G03F 1/00 (2006.01)
H01L 21/00 (2006.01)
(52) U.S. Cl. .......................... 430/5; 430/311
(58) Field of Classification Search ............... 430/5, 430/311
See application file for complete search history.

(56) References Cited

U.S. PATENT DOCUMENTS

| 4,876,164 | A | 10/1989 | Watakabe et al. |
| 5,871,658 | A | 2/1999 | Tao et al. |
| 5,948,570 | A | 9/1999 | Kornblit et al. |
| 6,406,818 | B1* | 6/2002 | Zemen et al. ................... 430/5 |
| 6,472,107 | B1 | 10/2002 | Chan |
| 6,846,747 | B2 | 1/2005 | Westerman et al. |
| 6,960,416 | B2 | 11/2005 | Mui et al. |
| 6,989,219 | B2 | 1/2006 | Magg |
| 6,998,206 | B2 | 2/2006 | Fuller et al. |
| 7,037,628 | B2 | 5/2006 | Tsai et al. |
| 7,067,227 | B2 | 6/2006 | Montgomery et al. |
| 2003/0003374 | A1* | 1/2003 | Buie et al. ..................... 430/5 |
| 2003/0180631 | A1* | 9/2003 | Shiota et al. ................... 430/5 |
| 2004/0209477 | A1* | 10/2004 | Buxbaum et al. ........... 438/710 |
| 2004/0262264 | A1* | 12/2004 | Crawford et al. ............. 216/79 |

FOREIGN PATENT DOCUMENTS

JP          59189632 A       10/1984

* cited by examiner

*Primary Examiner*—Mark F Huff
*Assistant Examiner*—Jonathan Jelsma
(74) *Attorney, Agent, or Firm*—DeLio & Peterson, LLC; Kelly M. Nowak; Richard Kotulak

(57) ABSTRACT

Methods for manufacturing a photomask, such as a chrome on glass photomask and a phase shift photomask are provided. A selective main chrome etch and a selective chrome overetch in the fabrication process provides a photomask having improved image quality and provides nominal image size control and image size uniformity across the photomask within current process flows and manufacturing steps. The selective etch process utilizes a main etch where the resist etch selectivity (amount of chrome removed to resist removed) is higher than in the overetch step in which the etch is more selective to removal of the resist layer relative to the chrome layer. To control the etch selectivities the composition of the etchant chemistry and/or the etchant reactor hardware settings (power, voltage, etc.) can be adjusted.

12 Claims, 7 Drawing Sheets

METHOD TO ETCH CHROME FOR PHOTOMASK FABRICATION

BACKGROUND OF THE INVENTION

1. Field of the Invention

This invention relates to a method and apparatus for improving resolution of critical features printed on an optical mask for semiconductor fabrication, and in particular, to a method and apparatus for etching chrome films on optical masks to improve the across mask image size uniformity and linearity and reduce errors in the nominal image size on optical masks.

2. Description of Related Art

In the manufacture of circuit patterns on electronic components, such as the manufacture of integrated circuits on semiconductor substrates, photomasks are used to transfer the desired circuit pattern onto the substrate workpiece. A photomask is typically employed a large number of times for the production of numerous electronic devices. This places stringent demands on the quality of a photomask since any flaws or defects in the photomask are reproduced in the workpiece, which directly affects the operability of the resultant workpiece.

One of the biggest technical challenges in photomask manufacturing is to build a high accuracy photomask that meets the stringent across mask critical dimension uniformity (CDU) specifications required by the semiconductor industry. The across mask CDU is typically obtained by measuring the line width of critical features on the mask at many locations across the mask using a Scanning Electron Microscope (SEM) and is expressed as a 3 sigma value in nanometers. For photomasks used for building semiconductor devices in the 90 nm technology node the mask CDU specification is typically <7 nm (3 sigma). For 65 nm devices the mask CDU specification is typically <5 nm (3 sigma) and for 45 nm devices the mask CDU specification is <3.5 nm (3 sigma). This invention is aimed at enabling achievement of these strict across mask CD uniformity specifications.

A conventional photomask comprises a patterned metal film, such as chrome, deposited onto the surface of a transparent base. To make the photomask the metal film is blanket deposited on the transparent base and covered with a photoresist. A desired pattern is exposed and developed on the photoresist, and then portions of the underlying exposed metal film are removed from the developed areas. Any remaining photoresist is subsequently removed leaving a patterned metal film on the substrate workpiece.

In typical processes of manufacturing a chrome film photomask, a wet etch process may be used in which cerium (IV) ammonium nitrate and perchloric acid are employed. However, the use of a wet etch process in the manufacture of a chrome mask makes it difficult to manufacture the mask with high accuracy as a result of the wet etching processes causing side etching effects/biases.

While the following description will be directed for convenience to chrome-on-glass (COG) masks, other masks such as phase shift (PSM) masks having a phase shift layer of for example MoSi on the glass surface may be made using the method of the invention. In general, the silicide layer is formed over the transparent substrate to provide good joining ability between the mask material of silicide and the substrate. A chrome layer and photoresist layer are then formed on the MoSi layer as described above.

Dry etch processes are preferably employed for the formation of chrome photomasks. A typical dry etch process of chrome masking typically employs the use of a mixed gas of chlorine, e.g., $Cl_2$ and oxygen ($O_2$). The dry etch processes were found to be advantageous for manufacturing a mask with high accuracy, however, the etch rate of chrome using conventional dry etch processes is low and not selective. Additionally, such conventional dry etch processes typically cause several defects in the pattern for the photomask, such as opaque defects, clear defects, and poor resolution features, which in turn are transferred to the workpiece rendering it inoperable.

As a result of the difference in etch selectivity between the resist and chrome films, the resists have been modified to improve their etch resistance and selectivity to the underlying chrome film during dry etch processes. For example, a prior art technique to improve resolution features on the resultant mask is to reduce the thickness of the photoresist film deposited thereover the chrome film. The thinning of the resist film may however, lead to the resist film being completely removed during the chrome etch before the patterned images are fully transferred into the chrome layer. Other techniques of modifying the resists to improve their etch resistance and selectivity to the underlying chrome film during dry etch processes has been to modify the resist chemistry. However, it has been found that increasing etch resistance of the material can also degrade important resist performance parameters, such as, sensitivity, image quality and stability of the resist.

Accordingly, a need continues to exist in the art to provide an improved method to make a photomask that allows for the achievement of the desired nominal image size and image size uniformity on the photomask with a method which is efficient, easy and relatively inexpensive.

Bearing in mind the problems and deficiencies of the prior art, it is therefore an object of the present invention to provide an improved method for manufacturing a photomask such as a COG mask and a PSM mask which achieves a desired minimum feature size resolution on a photomask.

It is yet another object of the present invention to provide a method of making a photomask such as a COG mask and a PSM mask that will have improved across mask critical dimension uniformity and linearity of the photomask.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to a method of making a photomask which comprises:

providing a transparent substrate;

depositing an opaque layer on the transparent substrate;

depositing a resist layer on the opaque layer;

imaging and developing a resist mask pattern in the resist layer which exposes portions of the opaque layer;

etching the exposed portions of the opaque layer using a first etchant in a main etch step that etches both the opaque layer and the resist layer and forms a patterned opaque layer;

etching any residual opaque layer in an overetch step using a second etchant that is more selective to etching the resist layer than the opaque layer than the first etchant; and removing the resist layer and forming the photomask.

The transparent substrate typically comprises quartz, glass, silica glass, polysilicate glass, soda glass, or a thin membrane material made of silicon, SiN, SiC or diamond. The opaque layer generally has a thickness ranging from about 500 Å to about 1200 Å, and preferably comprises a chrome-based material including chrome or Cr:O:N. The resist layer typically has a thickness of about 2000 Å to 5000 Å.

The photomask formed in the opaque layer in accordance with the method of the instant invention forms lithographic photomasks including optical photomasks, EUV photomasks, X-ray photomasks, SCALPEL photomasks and photomasks in technologies typically using a chrome film as a pattern blocking layer and/or transparent film such as MoSi to form a phase shift photomask (PSM). In the PSM, a quartz substrate is overlaid with a MoSi layer followed by a patterned chrome layer. The MoSi layer is then patterned to form the PSM as is known in the art.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
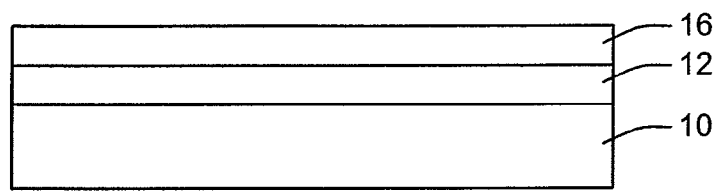
FIGS. 1A-1D are cross-sectional views showing the process steps of the invention for manufacturing a photomask.

In describing the preferred embodiment of the present invention, reference will be made herein to FIGS. 1A-7B of the drawings in which like numerals refer to like features of the invention. Features of the invention are not necessarily shown to scale in the drawings.

The present invention relates to a method for making a photomask using a main etch and an overetch step to etch the opaque layer forming the desired pattern in the opaque layer of the mask. The present invention improves the minimum resolution features that can be achieved on a photomask as well as improving the post etch feature size linearity and critical dimension uniformity that can be achieved on a photomask within current process flows and manufacturing. The instant invention overcomes such photomask manufacturing problems by advantageously adjusting the chrome (opaque layer) to resist selectivity for the main etch and the overetch step.

Figure 1B:
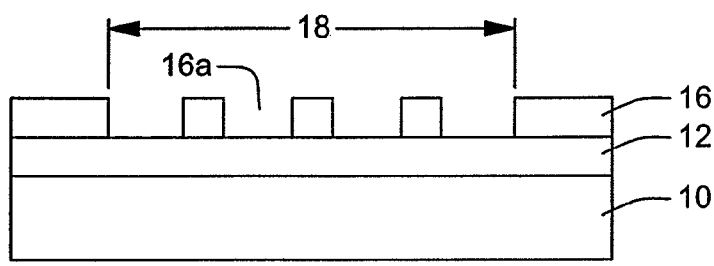
Figure 1C:
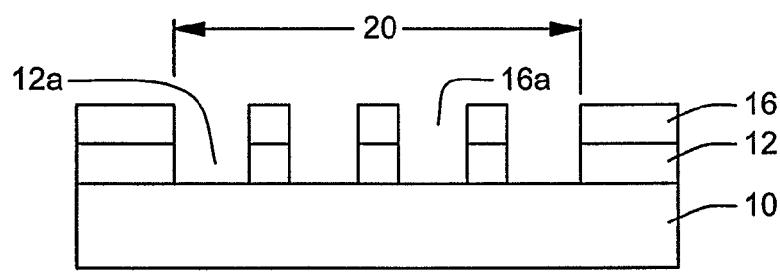

Referring to the drawings, FIGS. 1A-C shows a chrome photomask process and the resultant mask. As illustrated in FIG. 1A, a silica glass substrate 10 is provided with a chrome film 12 deposited thereon to a thickness typically of about 500 Å to about 1000 Å. A resist film 16 is then deposited directly thereover the chrome film 12 to a thickness typically of about 2000 Å to 5000 Å. For optical mask fabrication, the resist film is used as both the imaging layer and the masking layer for pattern transfer into the chrome film as shown in FIGS. 1B and 1C.

FIG. 1B shows the resist layer 16 developed to form the desired pattern 18 with openings 16a.

FIG. 1C shows the chrome layer 12 etched using the main etch step of the invention. Patterned openings 12a corresponding to resist opening 16a are formed in the chrome layer.

Figure 1D:
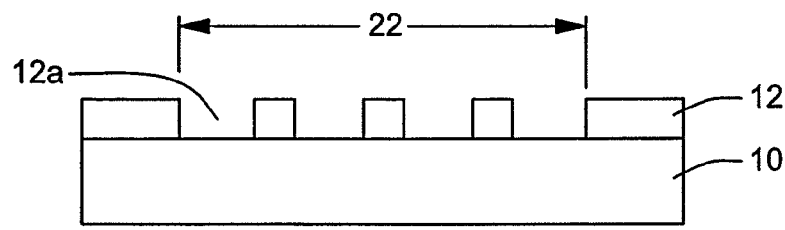

FIG. 1D shows the final photomask comprising desired pattern 22 with openings 12a in the opaque layer 12. The patterned openings 12a are more uniform in size than those openings obtained using prior art processes as discussed below.

The following description is an application of the present invention in a dry etching process of an opaque layer, preferably a chrome film, for formation of an optical mask. While the preferred embodiment of the present invention is described in terms of the dry etch process of a chrome film to form an optical mask, it will be understood and appreciated by those skilled in the art that the present invention includes etching processes of other films for formation of a variety of masks, and is generally applicable to the manufacturing processes of electronic devices and structures.

Referring again to FIGS. 1A-D, the substrate 10 which may comprise a transparent substrate made from a material including quartz, glass, silica glass, polysilicate glass, soda glass, thin membrane materials made of silicon, SiN, SiC and diamond, and the like. An opaque first layer 12, preferably comprising a metal layer, is deposited over the substrate 10 to a thickness typically of about 500 Å to about 1000 Å. The first layer 12 may comprise a chrome-based layer including a chrome layer or a Cr:O:N layer. The chrome layer 12 may be conformally deposited onto the quartz substrate 10 by known techniques, such as, evaporation, sputtering, and the like.

A resist layer 16 is then deposited over the opaque layer. The resist layer 16 may be deposited by known techniques including, for example, spin coating, and the like. Resist layer 16 may comprise a positive or a negative resist layer and typically is about 2000 Å to 5000 Å thick.

FIG. 1B illustrates, after deposition of the resist layer 16, the resist layer may be patterned by imaging the resist by exposure to either light or electron beam and then developing the resist layer to form a resist mask pattern 18 in the resist layer 16. As shown in FIG. 1B, the resist mask pattern 18 having openings 16a exposes underlying portions of the opaque layer 12.

Figure 6A:
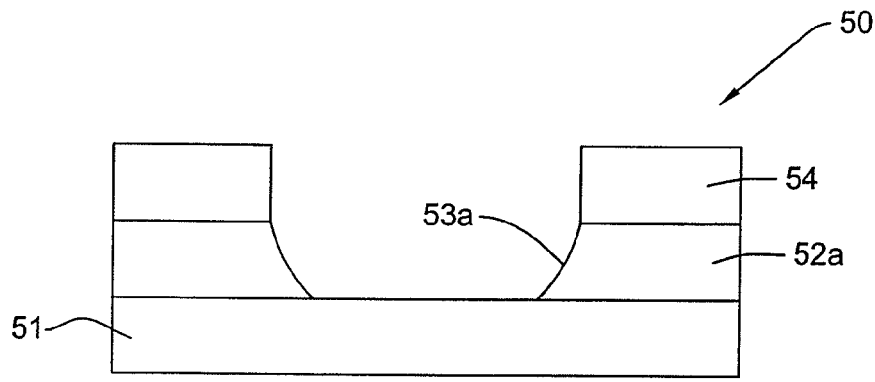
FIGS. 6A-6B are cross sectional views showing the etched chrome sidewall profile immediately after the main etch step is completed and after the final overetch step is completed, respectively.
Figure 6B:
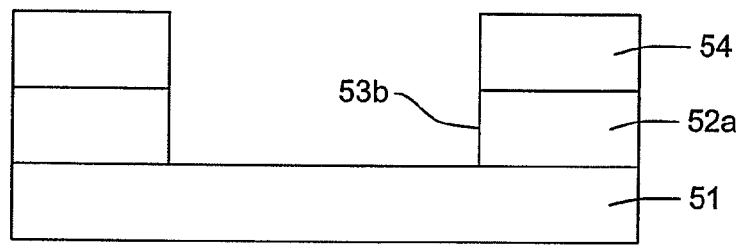

As shown in FIG. 1C, the image 18 in the resist layer is then transferred into the chrome layer 12 using an etchant which etches the chrome layer and the resist layer at about the same rate. A pattern 20 having opaque openings 12a and corresponding resist openings 16a is formed. The opaque openings are generally angled as shown in FIGS. 6A-6B but are not shown here for clarity. The etchant is typically $Cl_2/O_2$, or other $Cl_2/O_2$ containing mixtures such as containing He. As will be more fully discussed below, the selectivity of the etch may be controlled by adjusting the process conditions such as voltage and duty cycle, controlling the etchant mixture, or combinations thereof. For example, it is preferred herein to control the etch selectivity by adding a material such as $CO_2$ to the etchant mixture to reduce the aggressiveness of the etchant and provide a main etch selectivity of about 0.45 to 1. Etch selectivity ratio as used herein refers to the amount of chrome removed versus the amount of resist removed per unit of time and is expressed as a ratio of Cr/resist. Thus, a selectivity of 0.45 means the relative removal of 0.45 Cr and 1 resist in a unit of time. A selectivity of 1 means that both Cr and resist are removed (etched) at a same rate per unit of time.

The overetch step is now performed as also shown in FIG. 1D using a $Cl_2/O_2$ mixture but the etchant conditions and/or etchant composition are controlled to etch the resist layer faster than the chrome layer (low selectivity to resist, e.g., lower etch selectivity ratio). In a preferred embodiment the same etchant is used as in the main etch without the $CO_2$.

Table 1 compares the across mask CD uniformity (expressed as a 3 sigma value in nanometer dimension) for two gate level masks processed with different overetch conditions. In this case the main etch for both masks was identical (only the overetch condition was different). Mask A had an overetch etch selectivity ratio that was the same as the main etch selectivity ratio. Mask B using the method of the invention had an overetch etch selectivity ratio that was more aggressive (low selectivity to resist—lower etch selectivity ratio) than the main etch selectivity ratio. In the specific embodiment for Mask B, the overetch condition was made more aggressive to removing the resist than removing the chrome (lower selectivity to resist) by increasing the duty cycle of the lower electrode RF power setting by 20%. As the table clearly illustrates, Mask B clearly had a substantial reduction (61%) in the amount of change/degrade in the across mask CD uniformity due to the etching process.

Table 2 compares again selectivity for main etch and over etch steps for different substrates as well as global CD uniformity. POR is prior art and new is the invention.

Table 3 compares the linearity range with the invention having the lowest range in linearity for clear measurements designated feature sizes range from 200 nm to 1000 nm in size.

TABLE 1

Mask CD Uniformity

| | CD Uniformity of Resist Image Before Dry Etching (3 sigma) nm | CD Uniformity of Final Etched Mask (3 sigma) nm | Change in CD Uniformity Due to Etching Process (nm) |
|---|---|---|---|
| Mask A | 3.4 | 5.7 | 2.3 |
| Mask B | 3.9 | 4.8 | 0.9 |

TABLE II

CD Uniformity and Selectivity Comparison for Different Substrates

| Substrate Type | POR CDU | NEW CDU | POR selectivity | NEW selectivity |
|---|---|---|---|---|
| 770 Angstrom chrome film on COG mask | 5.2 nm | 3.95 nm | 0.79 (main) 0.79 (OE) | 0.61 (main) 0.58 (OE) |
| 490 Angstrom chrome film on Phase Shift Mask | 6.65 nm | 4.4 nm | 0.73 (main) 0.73 (OE) | 0.90 (main) 0.70 (OE) |
| 550 Angstrom chrome film on Phase Shift Mask | 5.95 nm | 3.45 nm | 0.63 (main) 0.63 (OE) | 0.90 (main) 0.42 (OE) |

TABLE III

Linearity Data Range Comparison

| Process | Prior Art | CO2 Etch | New Cr Etch |
|---|---|---|---|
| X range Clear | 19.13 nm | 22.1 nm | 12.7 nm |
| Y range Clear | 17.1 nm | 19.69 nm | 11.69 nm |

The final mask is shown in FIG. 1D having the desired pattern 22 including openings 12a.

The pattern contained in the photomask may then be reproduced onto a surface of a workpiece typically by placing the photomask over the workpiece and irritating a radiation-sensitive resist material on the workpiece. The variety of radiation sources includes visible light, ultraviolet light, x-ray radiation, electrons, ions and EUV (Extreme Ultraviolet). When illuminated by the radiation, the opaque layer pattern on the photomask serves to selectively block portions of the radiation beam while allowing other portions to be transmitted through the openings in the opaque layer. In this manner, complex geometries having very narrow line widths can be reproduced allowing the economical production of very large-scale integrated circuits and other devices.

A dry-etching process is generally conducted in a vacuum chamber in which gases, typically chlorine and oxygen are injected. An electrical field is created between an anode and a cathode in the vacuum chamber thereby forming a reactive gas plasma. Positive ions of the reactive gas plasma are accelerated toward the photomask which is oriented such that the surface area of the quartz substrate is perpendicular to the electrical field. The directional ion bombardment enhances the etch rate of the Cr opaque material in the vertical direction but not in the horizontal direction.

The reaction between the reactive gas plasma and the Cr opaque material is a multi-step process. First, a reaction between the chlorine gas and exposed Cr opaque material forms chrome radical species. The oxygen then reacts with the chrome radical species to create a volatile which can "boil off" thereby removing the exposed Cr opaque material.

As shown in FIG. 1D, after the main etching and overetch processes are completed, the photosensitive resist material in the photomask 16 is stripped away. The dimensions of the Cr opaque material on the finished photomask are then measured to determine whether or not critical dimensions are within specified tolerances. Critical dimensions may be measured at a number of locations on the finished photomask, summed, and then divided by the number of measurements to obtain a numerical average of the critical dimensions. This obtained average is then compared to a specified target number (i.e., a mean to target comparison) to ensure compliance with predefined critical dimensions specifications. The measured critical dimensions typically must also conform to a specified Uniformity requirement. Uniformity is typically defined as a range (maximum minus minimum) or a standard deviation of a population of measurements.

Conventional plasma etch systems such as the Applied Materials, Inc. TETRA® DPS™ etch system (available from Applied Materials, Inc., of Santa Clara, Calif.) or the Generation 4 Photomask Etcher from Unaxis Inc (St. Petersburg, Fla.). may be used to provide excellent results. A plasma processing system which permits separate power application for plasma generation and for substrate biasing is preferred and is commonly referred to as a Decoupled Plasma Source (DPS). Substrate biasing is used to attract ions and other high energy species from the plasma toward the substrate surface, enabling anisotropic etching. Separate application of power for plasma generation and power for substrate biasing permits separate control of the plasma density and the attractive forces (DC voltage) generated on the surface of the substrate.

The main chrome mask layer etch is preferably performed using a plasma generated from a chlorine-oxygen-helium-$CO_2$ gas mixture. $CO_2$ is used to control the selectivity of the etchant wherein $CO_2$ is added to reduce the aggressiveness of the etchant (higher Cr/resist ratio) to the resist layer. The molecular ratio of the chlorine:oxygen:helium:$CO_2$ gas mixture may vary widely such as 75:5:5:0 to 150:10:10:0 and is typically about 105:7:7:0. When $CO_2$ is used the ratio is typically about 105:2:5:7 to 150:2:5:14. The total gas flow rate may likewise vary widely at about 85 to 170 sccm and is generally about 119 sccm. The ICP coil is powered to generate a high density plasma having the desired Cr: resist selectivity. The lower electrode is powered to produce a suitable bias voltage. The temperature of the substrate is typically about 25° C., while the wall temperature of the process chamber is typically about 25-50° C. The pressure in the chamber is generally 2-5 mT, e.g., 2.5 mT. The etch end point may be detected by optical emission spectroscopy as is well-known in the art, for example, discussed in U.S. Pat. No. 5,871,658, which patent is hereby incorporated by reference The chrome layer is then overetched beyond endpoint to remove residual chrome from open regions and to leave a vertical sidewall. The overetch step is generally an extension of the chrome etch process described above but in the method of the invention is performed under different etchant conditions and/or a different etchant chemistry forming a more aggressive etch of the resist versus the chrome than in the main etch step. In a preferred method, conditions are the same as the main etch but the $CO_2$ is removed from the etchant mixture.

FIG. 6A shows a typical chrome etch sidewall profile after the main etch step is completed. FIG. 6B shows a typical chrome etch sidewall after the overetch is completed. The figure clearly illustrates that the overetch step is required for obtaining a near vertical chrome etch sidewall. Having a vertical chrome sidewall is important for meeting the CD uniformity and mean to target specifications on the photomask.

Figure 7A:
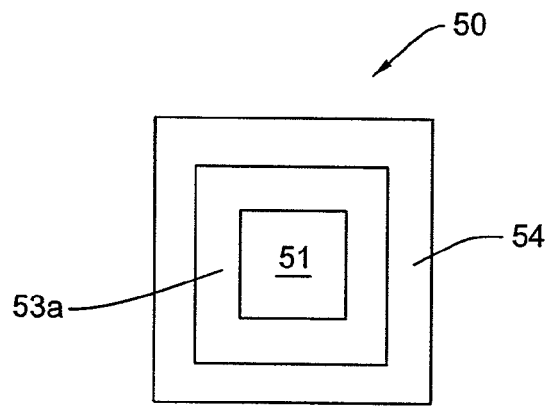
FIGS. 7A and 7B are partial top down views showing the role of the main etch step and overetch step, respectively, in etching out a square feature on the photomask.
Figure 7B:
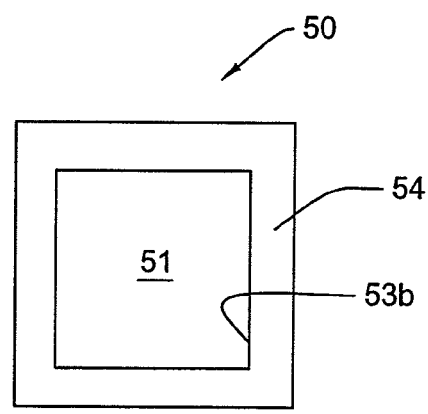

Another way of illustrating the important functions of the main etch and overetch steps is shown in FIGS. 7A-7B. These figures are partial top down views of a square shape on the photomask that is to be etched away. Region 1 of the figure shows the chrome that was removed from the square shape during the main etch step leaving the bare quartz substrate, and region 2 of the figure shows the additional chrome material that is removed during the overetch step of the chrome etch process. As the figures illustrate, the overetch step is key for defining the ultimate final dimension of the square shape on the photomask. FIGS. 6A-6B and 7A-7B are discussed in detail below.

After completion of the main and overetch chrome layer etch, a strip and clean process is typically performed to remove any residual contaminants from the surface of the chrome layer. The strip chemical used is typically heated sulfuric peroxide and applied over the surface of the substrate plate. After treatment with sulfuric peroxide, the substrate plate is rinsed with $CO_2$-reionized, or $CO_2$-sparged deionized water. After strip, the substrate plate is typically subjected to an acid clean using an industry standard 70:30 $H_2SO_4/H_2O_2$ solution, followed by another deionized water rinse.

Figure 5:
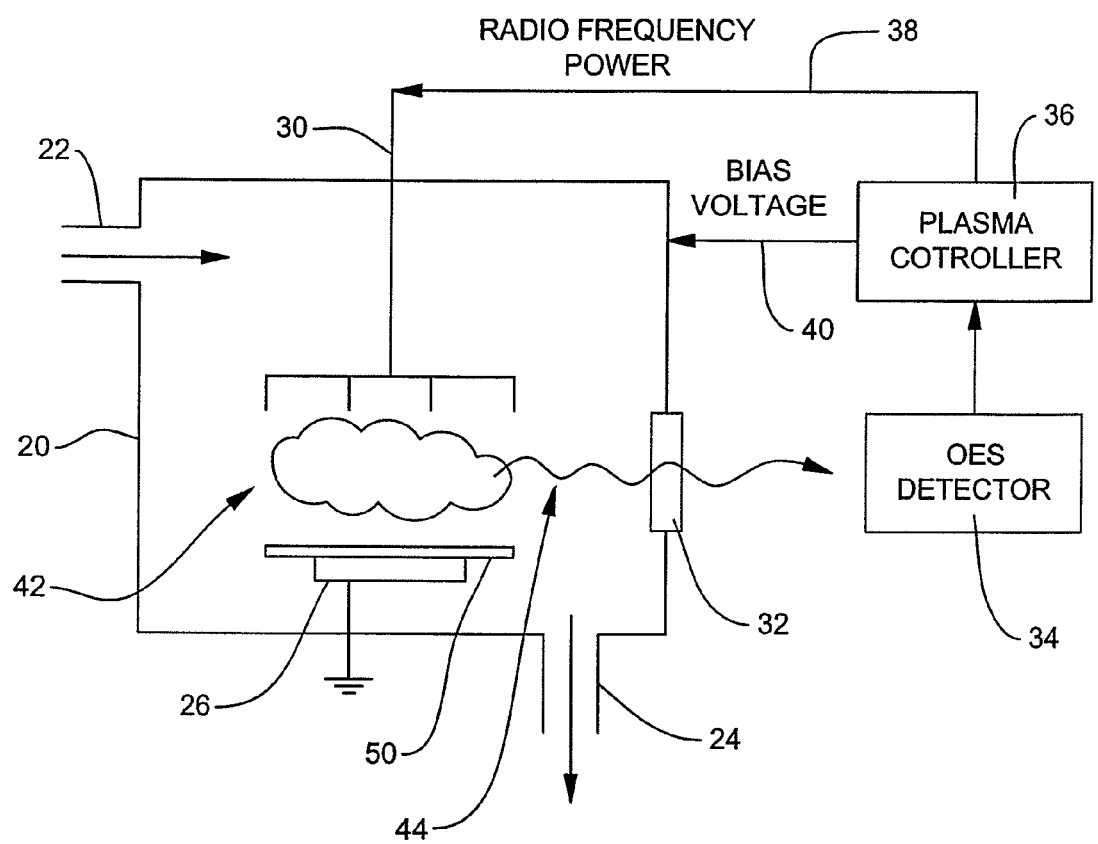
FIG. 5 is a schematic of a reactor chamber used to etch the photomask.

Referring now to FIG. 5 there is shown a schematic cross-sectional diagram of a high density plasma (HDP) (RIE) plasma reactor chamber typically employed in accordance with the invention. Shown in FIG. 5 is a reactor chamber 20 having a platen 26 upon which is placed a substrate 50. The substrate 50 has formed thereon a blanket chrome layer (not shown) which is desired to be patterned into a chrome photomask by etching the chrome through a patterned photoresist layer as described above.

The reactor chamber 20 has an inlet port 22 through which an etchant gas composition is introduced into the reactor chamber when etching through the HDP RIE plasma etch method. Reacted and unreacted etchant gas and reaction byproducts are exhausted from the reaction chamber 20 by means of a pump (not shown) through outlet port 24.

Also shown in FIG. 5 is a radio frequency electrode 30 through which a radio frequency power is introduced into the reactor chamber 20 to form within the reactor chamber etchant plasma 42. The etch is monitored using an optical emission spectroscopy (OES) detector 34. An output from the OES detector is fed to a plasma controller 36 which controls the plasma and etch. According to the method of the invention the etching of the chrome layer in the main etch and overetch steps is controlled by controlling the selectivity of the etchant gas chemistry as well as by adjusting either or both the radio frequency power (RFP) or bias power (BP) conditions during the etching process to control the selectivity of the etch.

It is an important feature of the invention that the main etch be performed under etchant conditions and/or an etchant composition wherein the etchant has a selectivity of the amount of chrome removed to the amount of resist removed (Cr:resist) ratio of about 0.4 to 1 or higher, preferably 0.45 to 1 and most preferably 0.75 to 1 and that the overetch step be more aggressive to the etching of the photoresist layer than the chrome layer vis-à-vis the main etch. The Cr:resist selectivity ratio for the overetch is therefore lower than the main etch ratio and is typically about 0.3 to 0.75, preferably 0.45 to 0.6. The important feature of the invention is that the etch selectivity ratio for the main etch etchant be higher than the etch selectivity ratio for the overetch etchant. Using such selectivities for the main etch of the chrome in combination with the overetch step has been found to provide an enhanced process for making a photomask having improved CD uniformity.

The combination of the main etch and the overetch selectivities provides the method of the invention which forms a mask having excellent CDU properties.

It is an important feature of the invention that the etchant conditions be adjusted to provide a main etch having a Cr:resist ratio greater than the overetch ratio, e.g., for a main etch ratio of 0.8, the overetch ratio is less than 0.8. A preferred main etch selectivity ratio is 0.9 and an overetch selectivity ratio is 0.7. To form such a selective etch plasma it is preferred to adjust the reactor voltage and duty cycle during the etchant process.

Figure 3A:
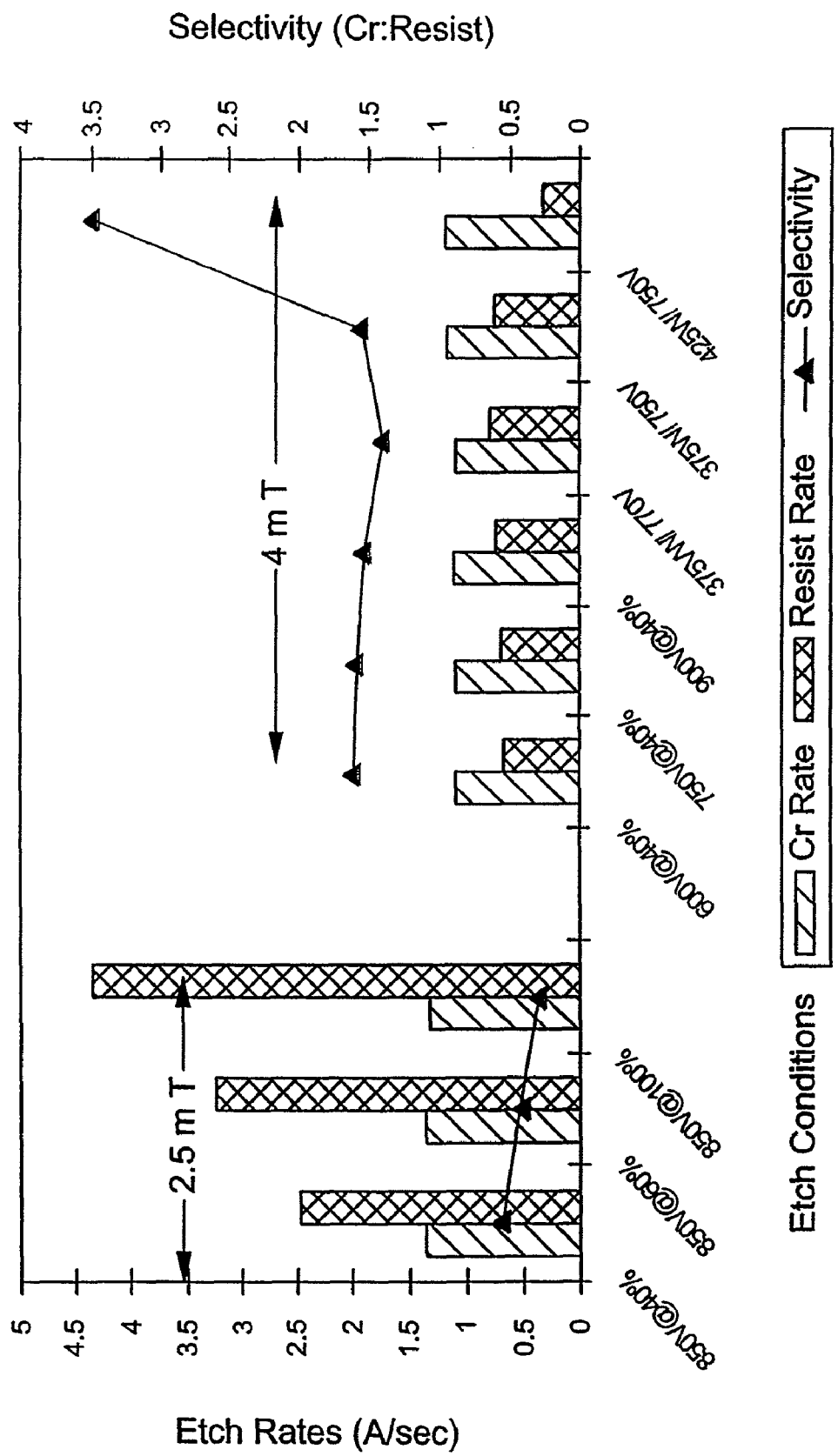
FIGS. 3A and 3B show the difference in opaque layer and resist layer etch selectivity based on electrode voltage and RF power duty cycle of the etchant process conditions.
Figure 3B:
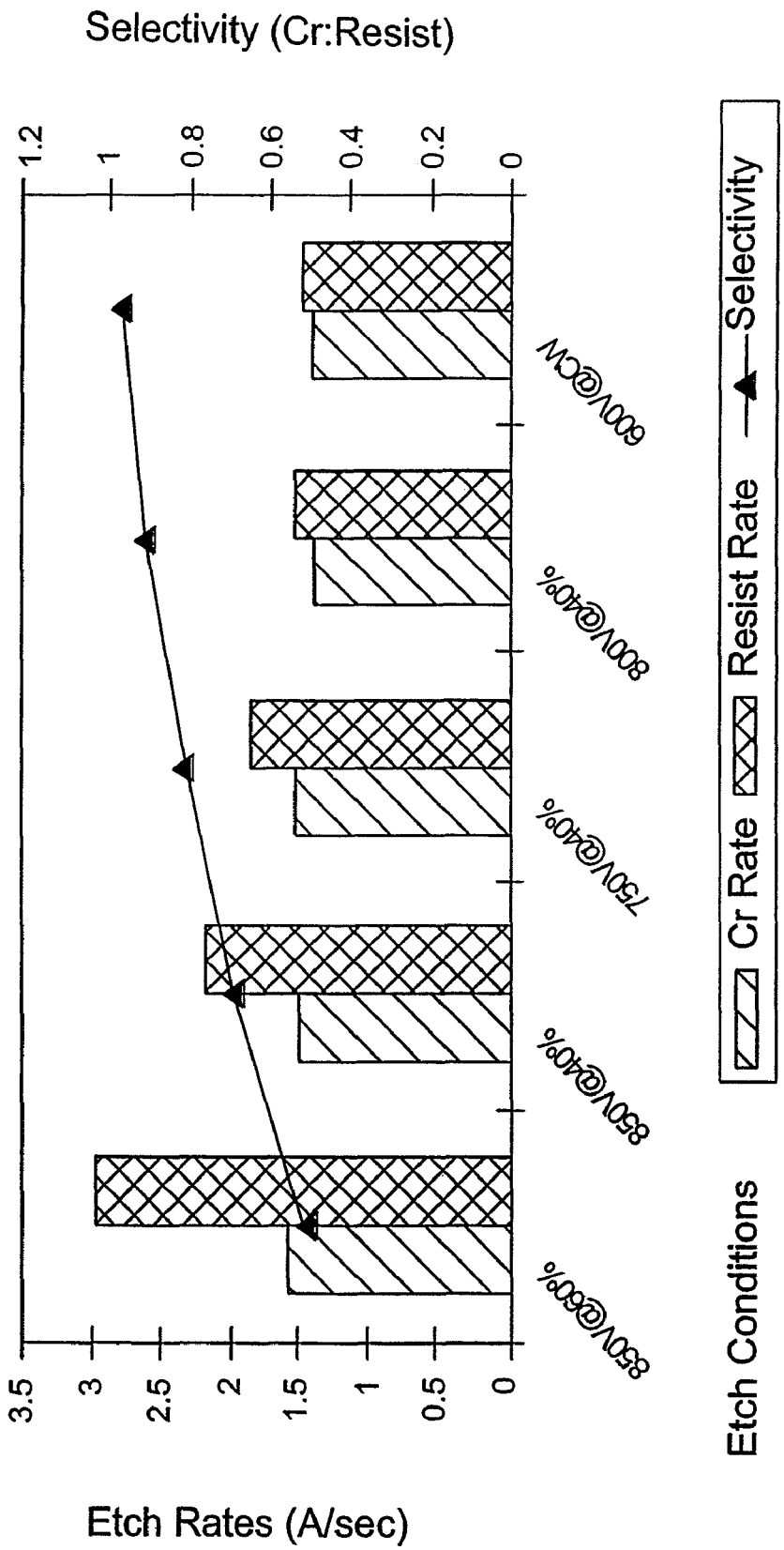

FIGS. 3A and 3B show the etch selectivity ratio based on voltage and duty cycle and the corresponding selectivity ratios.

The etchant composition can also be adjusted to change the selectivity. For example, it is preferred that a gas such as $CO_2$ be added to the $Cl_2/O_2$ (usually containing He also) mixture to moderate the aggressiveness of the etchant to the resist.

Figure 2A:
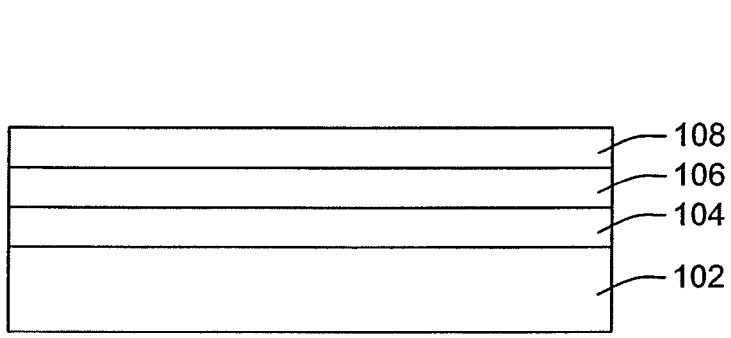
FIGS. 2A-2E are cross-sectional views showing the process steps of the invention for manufacturing a phase shift photomask.
Figure 2B:
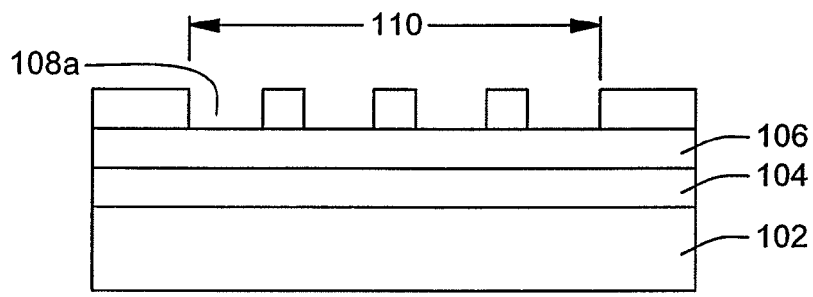
Figure 2C:
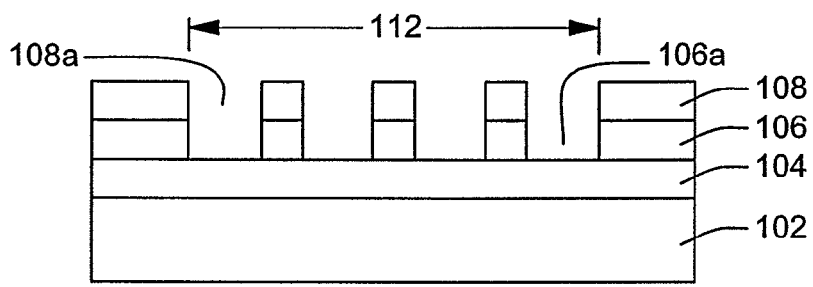
Figure 2D:
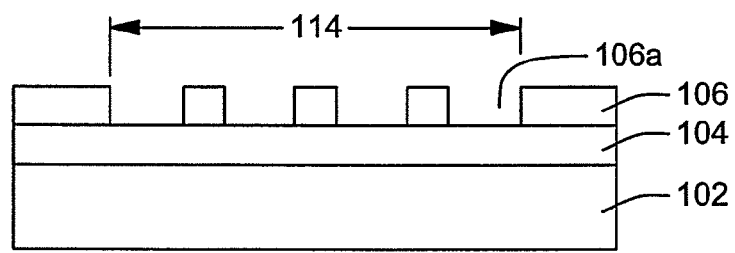
Figure 2E:
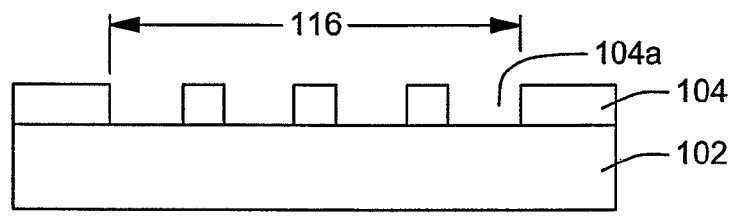

Referring now to FIGS. 2A-2E, the method of the invention is shown to make a phase shift mask. A substrate to be etched is shown as numeral 100 and comprises a transparent substrate 102, having in sequence thereon a MoSi phase shift layer 104, a chrome layer 106, and a photoresist layer 108. FIG. 2B shows the resist layer 108 being patterned forming a pattern 110 having openings 108a. In FIG. 2C the chrome layer 106 is shown being etched to form openings 106a which correspond to resist openings 108a forming a pattern 112. In FIG. 2D, the resist 108 is then removed and the MoSi film 104 is etched away to form openings 104a which correspond to chrome openings 106a forming a pattern 114. Next, the chrome 106 is removed providing the phase shift mask comprising a transparent substrate 102 and a patterned (116) MoSi layer 104 having openings 104a as shown in FIG. 2E.

Figure 4A:
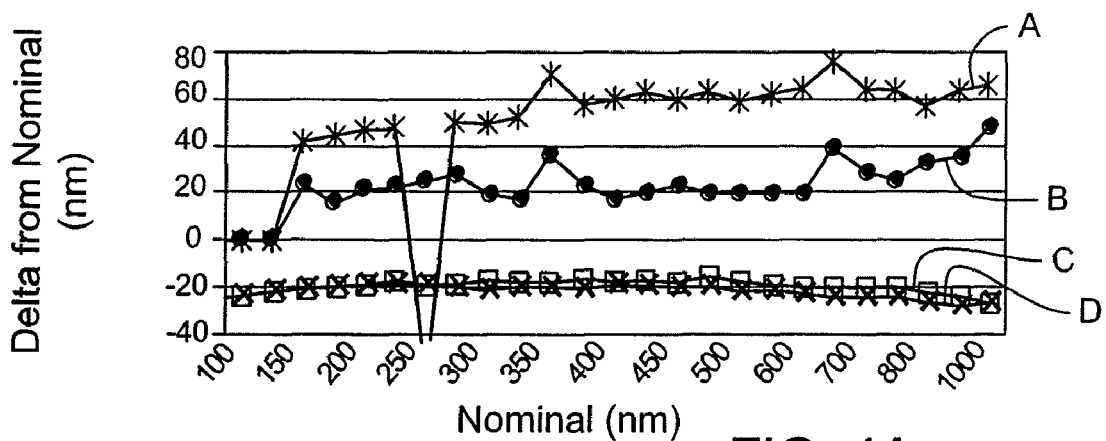
FIGS. 4A-4C are graphs showing the improved linearity of the mask pattern obtained using a first etchant and an overetch etchant in the method of the invention (FIG. 4C) versus the use of different etchants of FIGS. 4A and 4B.
Figure 4B:
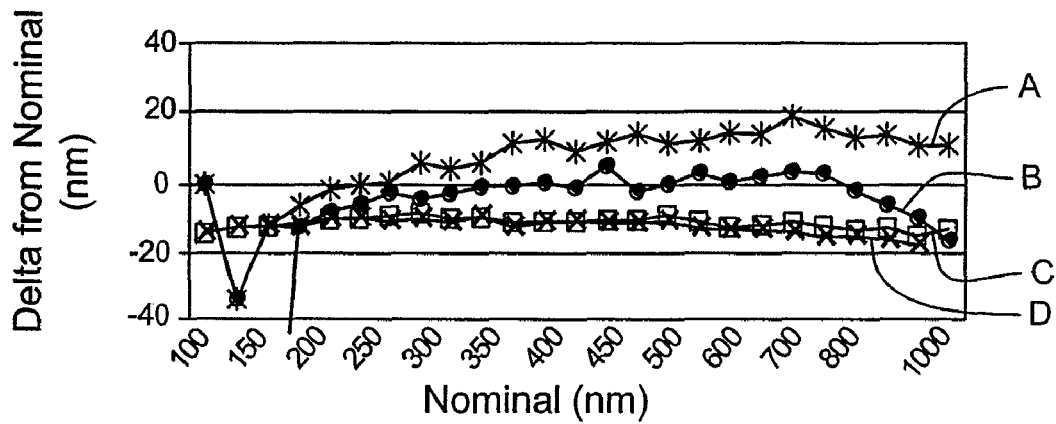
Figure 4C:
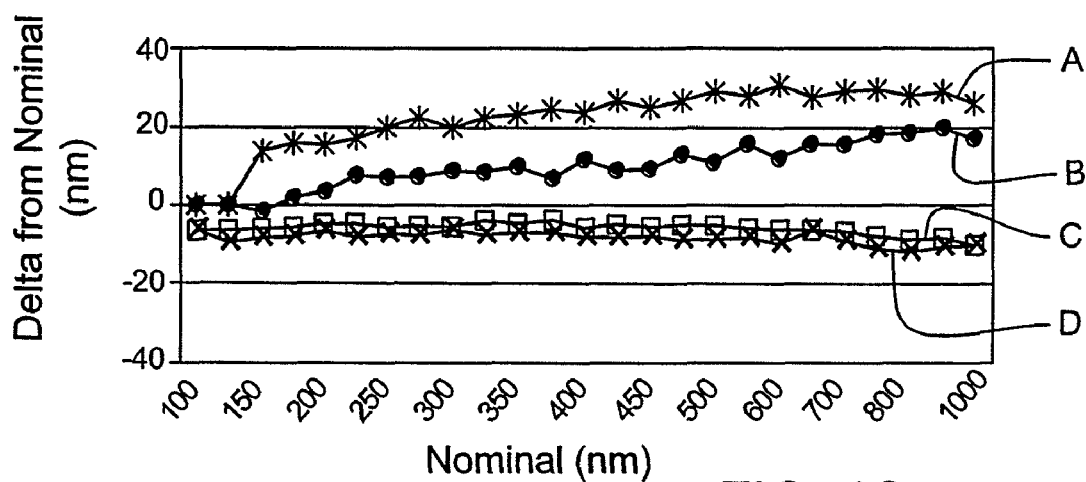

Referring now to FIGS. 4A-4C, the advantages of the present invention can be demonstrated vs. comparative processes using a different etch selectivity process.

FIG. 4A shows the linearity of the chromium features using a main etch having a main etch selectivity of about 0.61 and an overetch selectivity of about 0.61. In FIG. 4B the main etch was performed using a main etch having a selectivity ratio of 0.90 and an overetch ratio of about 0.90. In FIG. 4C, which is the method of the invention, the main etch was performed using an etch which has about the same selectivity for chrome as it does for the resist (Cr:resist ratio about 0.90) and the overetch was very aggressive towards the resist vs. the chrome (etch selectivity ratio about 0.60).

Lines A (X-Line), B (Y-Line), C (X-Space), and D (Y-Space) represent the measured feature size of the lines and spaces on the etched substrate, and it is clear that the pattern of FIG. 4C has the best linearity.

FIGS. 6A and 6B are cross sectional views showing the etched chrome sidewall profile immediately after the main etch step in FIG. 6A and after the final overetch step is completed in FIG. 6B. A mask 50 having a quartz substrate 51 and a chrome layer 52a and resist layer 54 thereon has a sloped sidewall 53a after the main etch step. In FIG. 6B the overetch step of the invention has been completed and the chrome layer 52a is now shown having a vertical sidewall 53b. Thus, when using the method of the invention, the combination of the etch step and the overetch step using an etchant having the selectivities as discussed above provides a vertical sidewall chrome layer which has enhanced mask image size uniformity and linearity.

FIG. 7 is a top view of FIGS. 6A and 6B showing the combination of the main etch step and overetch step for etching out a square feature of a photomask. The photomask is shown generally as numeral 50 and as shown in FIG. 7A, the chrome has been etched to the quartz leaving opening 51 and chrome layer sidewall 53a remains after the main etch step. In FIG. 7B after the overetch, the chrome sidewall 53a has been removed by the overetch step and a straight sidewall 53b remains with the opening to the quartz substrate 51.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of making a photomask using a two-step opaque layer etching process which comprises:
    providing a transparent substrate;
    depositing an opaque layer on the transparent substrate;
    depositing a resist layer on the opaque layer;
    imaging and developing a resist mask pattern in the resist layer which exposes portions of the opaque layer;
    etching the exposed portions of the opaque layer using a first etchant in a main etch first step that etches both the opaque layer and the resist layer and forms a patterned opaque layer;
    etching any residual opaque layer in an overetch second step using a second etchant that etches both the opaque layer and the resist layer, whereby the second etchant needs to be more selective to etching the resist layer than the opaque layer; and
    removing the resist layer and forming the photomask; wherein the first etchant has a selectivity of the amount of opaque layer removed to the amount of resist layer removed of about 0.4 to 1 and the second etchant has a selectivity of the amount of opaque layer removed to the amount of resist layer removed of about 0.3 to 0.75.

2. The method of claim 1 wherein the first etchant selectivity is about 0.75 to 1 and the overetch selectivity is about 0.45 to 0.6.

3. The method of claim 1 wherein the opaque layer is chrome.

4. The method of claim 1 wherein both the first etchant and second etchant comprises $Cl_2$ and $O_2$.

5. The method of claim 4 wherein both etchants contain He.

6. The method of claim 5 wherein the first etchant contains $CO_2$.

7. A method of making a phase shift photomask using a two-step opaque layer etching process which comprises:
    providing a transparent substrate;
    depositing a phase shift layer on the transparent substrate;
    depositing an opaque layer on the phase shift layer;
    depositing a resist layer on the opaque layer;
    imaging and developing a resist mask pattern in the resist layer which exposes portions of the opaque layer;
    etching the exposed portions of the opaque layer using a first etchant in a main etch first step that etches both the opaque layer and the resist layer and forms a patterned opaque layer;
    etching any residual opaque layer in an overetch second step using a second etchant that etches both the opaque layer and the resist layer, whereby the second etchant needs to be more selective to etching the resist layer than the opaque layer;
    etching the phase shift layer; and
    removing the opaque layer and the resist layer and forming the phase shift photomask wherein the first etchant has a selectivity of the amount of opaque layer removed to the amount of resist layer removed of about 0.4 to 1 and the second etchant has a selectivity of the amount of opaque layer removed to the amount of resist layer removed of about 0.3 to 0.75.

8. The method of claim 7 wherein the first etchant selectivity is about 0.75 to 1 and the overetch selectivity is about 0.45 to 0.6.

9. The method of claim 7 wherein the opaque layer is chrome.

10. The method of claim 7 wherein both the first etchant and second etchant comprises $Cl_2$ and $O_2$.

11. The method of claim 10 wherein both etchants contain He.

12. The method of claim 11 wherein the first etchant contains $CO_2$.

* * * * *